(12) United States Patent
Kato et al.

(10) Patent No.: US 9,607,897 B2
(45) Date of Patent: Mar. 28, 2017

(54) SEMICONDUCTOR DEVICE AND METHOD FOR MANUFACTURING THE SAME

(71) Applicant: Semiconductor Components Industries, LLC, Phoenix, AZ (US)

(72) Inventors: Takanori Kato, Gunma (JP); Isao Nakatsuka, Saitama (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 79 days.

(21) Appl. No.: 14/635,669

(22) Filed: Mar. 2, 2015

(65) Prior Publication Data

US 2015/0262880 A1    Sep. 17, 2015

Related U.S. Application Data

(62) Division of application No. 13/259,871, filed as application No. PCT/JP2010/053490 on Feb. 25, 2010, now Pat. No. 9,059,225.

(30) Foreign Application Priority Data

Mar. 31, 2009  (JP) .................................. 2009-085849

(51) Int. Cl.
  *H01L 21/00*  (2006.01)
  *H01L 21/78*  (2006.01)
  (Continued)

(52) U.S. Cl.
  CPC ........ *H01L 21/78* (2013.01); *H01L 21/67132* (2013.01); *H01L 21/67282* (2013.01);
  (Continued)

(58) Field of Classification Search
  CPC ......... H01L 21/67092; H01L 21/67132; H01L 21/67282; H01L 21/6835; H01L 21/6836;
  (Continued)

(56) References Cited

U.S. PATENT DOCUMENTS 5,719,372 A * 2/1998 Togari ................ B23K 26/0622
                                                219/121.61
6,160,568 A * 12/2000 Brodsky .............. B23K 26/032
                                                347/238

(Continued)

FOREIGN PATENT DOCUMENTS

CN           1525536 A        9/2004
JP           07-022301        1/1995
(Continued)

OTHER PUBLICATIONS

Chinese Office Action issued in Chinese Application No. 201080012498.3 issued Jul. 30, 2013.

*Primary Examiner* — Mohammed Shamsuzzaman
(74) *Attorney, Agent, or Firm* — Kevin B. Jackson

(57) ABSTRACT

A method for manufacturing a semiconductor device is provided with: a step of preparing a semiconductor wafer (22) in a state where the circumference of the semiconductor wafer, which has been divided into semiconductor device parts, is adhered on a dicing sheet (21) supported by a wafer ring (23); a step of fixing the wafer ring (23) after transferring the wafer ring to a table (14) where laser printing is to be performed; and a step of marking on the main surface where the semiconductor material of the semiconductor device parts which configure the semiconductor wafer (22) is exposed, by radiating laser beams through the dicing sheet and an adhesive layer.

17 Claims, 12 Drawing Sheets

(51) Int. Cl.
*H01L 21/683* (2006.01)
*H01L 23/544* (2006.01)
*H01L 21/67* (2006.01)

(52) U.S. Cl.
CPC ........ *H01L 21/6836* (2013.01); *H01L 23/544* (2013.01); *H01L 2221/6834* (2013.01); *H01L 2221/68327* (2013.01); *H01L 2221/68381* (2013.01); *H01L 2223/54406* (2013.01); *H01L 2223/54426* (2013.01); *H01L 2223/54433* (2013.01); *H01L 2224/94* (2013.01)

(58) Field of Classification Search
CPC ... H01L 2221/68327; H01L 2221/6834; H01L 2223/54406; H01L 2223/54426; H01L 2223/54433; H01L 2223/54473; H01L 2224/13; H01L 23/544
USPC .......................... 438/463, 401, 462; 257/622
See application file for complete search history.

(56) References Cited

U.S. PATENT DOCUMENTS

| | | | |
|---|---|---|---|
| 6,423,399 B1* | 7/2002 | Endo | B41M 5/24 428/206 |
| 6,913,669 B2 | 7/2005 | Ensinger | |
| 7,135,384 B2 | 11/2006 | Takyu | |
| 8,158,493 B2* | 4/2012 | Shah | B23K 26/38 219/121.68 |
| 2004/0224483 A1 | 11/2004 | Takyu et al. | |
| 2006/0079040 A1* | 4/2006 | Tanaka | B23K 26/0736 438/166 |
| 2010/0078833 A1* | 4/2010 | Nakazato | H01L 21/561 257/787 |

FOREIGN PATENT DOCUMENTS

| | | |
|---|---|---|
| JP | 2003-115424 | 4/2003 |
| JP | 2004-172542 | 6/2004 |
| JP | 2004-311552 | 11/2004 |
| JP | 2005-101290 | 4/2005 |
| WO | 2009117451 A1 | 9/2009 |

* cited by examiner

SEMICONDUCTOR DEVICE AND METHOD FOR MANUFACTURING THE SAME

CROSS-REFERENCE TO RELATED APPLICATIONS

The present application is a divisional of U.S. application Ser. No. 13/259,871 filed Sep. 23, 2011 and issued as U.S. Pat. No. 9,059,225 on Jun. 16, 2015, which is a U.S. National Phase application under 35 U.S.C. §371 of International Application No. PCT/JP2010/053490, filed on Feb. 25, 2010, which claims the benefit of Japanese Application No. 2009-085849, filed on Mar. 31, 2009, the disclosure of which Applications are incorporated by reference herein.

TECHNICAL FIELD

The present invention relates to a semiconductor device and a method for manufacturing the same, and more particularly, to a semiconductor device including a marking on a main surface of the semiconductor device from which a semiconductor material is exposed and a method for manufacturing the same.

BACKGROUND ART

Semiconductor devices to be set in electronic equipment have been demanded to be smaller in size, thinner in thickness, and lighter in weight to be used in cell phones, portable computers, and the like. To satisfy these requirements, a semiconductor device called a CSP (Chip Scale Package) has been developed that has a size similar to that of a semiconductor element incorporated therein.

A WLP (Wafer Level Package) is an especially small type of the CSP (see, for example, Japanese Patent Application Publication No. 2004-172542). A general method for manufacturing a WLP includes: providing multiple semiconductor device portions arranged in a matrix in a semiconductor wafer; forming wirings and solder electrodes on a main surface of the semiconductor wafer, the wirings and solder electrodes being connected to diffusion regions of the semiconductor device portions; and then dicing the semiconductor wafer in a lattice pattern to separate the individual semiconductor device portions from one another.

In the above-described general method for manufacturing a WLP, however, making the thickness of the WLP to be manufactured to be, for example, 100 µm or less requires the semiconductor wafer before the dicing to be made to have an extremely thin thickness of 100 µm or less. This leads to a lower mechanical strength of the thinned semiconductor wafer and in many cases causes a problem of a semiconductor wafer being damaged in a transportation step or the like.

As a method for manufacturing a WLP solving such a problem, Dicing Before Grinding (hereinafter abbreviated as DBG) has been developed (see Japanese Patent Application Publication No. 2005-101290). In a method for manufacturing a semiconductor device employing the DBG, a semiconductor wafer on which wirings and the like are formed is half cut from the front surface, and then, the back surface of the wafer is ground. Thus, the semiconductor wafer is separated into individual semiconductor devices at half cut portions. The method for dividing the semiconductor wafer by the DBG is described with reference to FIG. 11 and FIG. 12.

With reference to Part (A) of FIG. 11, first, a semiconductor wafer 100 in which semiconductor device portions 108 are formed in a matrix pattern is prepared. An element such as a transistor is formed near the upper surface of each of the semiconductor device portions 108 by a diffusion step. The upper surface of the semiconductor wafer 100 is covered with an insulating layer 102 made of an oxide film. Wirings 104 connected to element regions are formed on the upper surface of the insulating layer 102. Further, external electrodes 106 made of a solder are formed on the wirings 104. The semiconductor wafer 100 has a thickness of about 280 µm, for example, in this step.

With reference to Part (B) of FIG. 11, next, the dicing is performed on the semiconductor wafer 100 from the upper surface, whereby grooves 110 are formed between the semiconductor device portions 108. The dicing in this step does not separate the semiconductor wafer 100, and the depth of the grooves 110 formed by the dicing is smaller than the thickness of the semiconductor wafer 100. For example, when the semiconductor wafer 100 has a thickness of 280 µm as described above, the depth of the grooves 110 is set to be about 100 µm. Thus, the semiconductor wafer 100 after this step is not separated, but is in a form of a single plate.

With reference to Part (C) of FIG. 11, the semiconductor wafer 100 is turned over and then the bottom surface of the semiconductor wafer 100 on which the wirings 104 are formed, is attached to an adhesive tape 112. Moreover, the semiconductor wafer 100 is ground from the upper surface to make the semiconductor wafer 100 thin over the entire area.

With reference to Part (D) of FIG. 11, the semiconductor wafer 100 is further ground from the upper surface to be separated into individual semiconductor device portions 108 at portions at which the grooves 110 are separated.

With reference to Part (A) of FIG. 12 and Part (B) of FIG. 12, subsequently, the back surface side (ground surface side) of each of the semiconductor device portions 108 is attached to an adhesive tape 114 made of a dicing sheet for example. Then, the adhesive tape 112 is peeled off. Thus, the semiconductor device portions 108 can be picked up from the front surface side (surface on which a circuit is formed) by peeling off the adhesive tape 12.

After the above step, the semiconductor devices are picked up to be separated from the adhesive tape 114. Then, a laser beam is applied on the bottom surface (surface from which the semiconductor material is exposed) to provide markings thereon. Then, the semiconductor devices are subjected to taping packaging or the like.

SUMMARY OF THE INVENTION

In the above-described manufacturing method for a semiconductor device, however, marking is performed through laser irradiation after the semiconductor devices are each picked up and the position of the picked up semiconductor device is recognized. Thus, the process of forming markings through laser irradiation is complicated and requires high cost.

Furthermore, if markings are provided by the direct application of the laser on the main surface of the semiconductor device made of a semiconductor material such as silicon, the markings are formed of only recesses and protrusions made by the laser irradiation. Thus, it is difficult to form a clear marking.

Still furthermore, it is difficult to increase an output of the laser and thus, it is difficult to form a clear marking by irradiating a surface from which the semiconductor material such as silicon is exposed with the laser. To be more specific, a relatively clear marking can be formed by applying a laser with longer wavelength, larger output, or longer irradiation time. Still, a YAG laser with a long wavelength of about 1000 nm applied on a thin semiconductor device with a semiconductor substrate having a thickness of 100 μm or less may adversely affect the circuit. This is because the laser applied on the back surface of the semiconductor substrate may reach the front surface of the semiconductor substrate. Moreover, larger laser output and longer laser irradiation time may lead to excessively high temperature on a portion on which the laser is applied. Thus, a crack may be formed at this portion.

The present invention is made in view of the above problems, and a main object of the present invention is to provide a semiconductor device in which a clear marking is formed through laser irradiation on a main surface of the semiconductor device from which a semiconductor material is exposed and a method for manufacturing the same.

A method for manufacturing a semiconductor device of the present invention comprises the steps of: preparing a semiconductor wafer divided into semiconductor device portions while being attached to a supporting sheet with an adhesive layer interposed therebetween, a peripheral portion of the supporting sheet being supported by a supporting ring; fixing the supporting ring after being moved to a printing table at which a laser printing is performed, the supporting ring having the semiconductor wafer attached to the supporting sheet; and performing marking on a main surface of each of the semiconductor device portions included in the semiconductor wafer by causing a laser to pass through the supporting sheet and the adhesive layer and to be applied on the main surface, the main surface having a semiconductor material of the semiconductor device portions exposed therefrom, the laser.

A method for manufacturing a semiconductor device of the present invention comprises the steps of: preparing a semiconductor wafer having a plurality of semiconductor device portions formed therein while being attached to a supporting sheet with an adhesive layer interposed therebetween, a peripheral portion of the supporting sheet being supported by a supporting ring; fixing the supporting ring after being moved to a printing table at which a laser printing is performed, the supporting ring having the semiconductor wafer attached to the supporting sheet; performing marking on a main surface of each of the semiconductor device portions included in the semiconductor wafer by causing a laser to pass through the supporting sheet and the adhesive layer and to be applied on the mam surface, the mam surface having a semiconductor material of the semiconductor device portions exposed therefrom; and separating the semiconductor wafer into the semiconductor device portions.

A semiconductor device of the present invention comprises: a semiconductor substrate having an element region formed therein and including a first main surface and a second main surface opposite to each other; a wiring layer provided on a side of the first main surface of the semiconductor substrate and connected to the element region; and a marking formed by applying a laser on the second main surface of the semiconductor substrate, wherein a carbide of resin made by the application of the laser is attached to a region at which the marking is formed on the second main surface of the semiconductor substrate.

A method for manufacturing a semiconductor device of the present invention comprises the steps of: preparing a semiconductor wafer including a first main surface and a second main surface that are opposite surfaces, as well as semiconductor device portions that are arranged in a matrix and include wirings formed on a side of the first main surface; dicing the semiconductor wafer from the side of the first main surface along border lines between the semiconductor device portions to form grooves each having a depth smaller than a thickness of the semiconductor wafer; separating the semiconductor device portions at portions at which the grooves are formed by grinding the semiconductor wafer from a side of the second main surface; attaching the second main surface of the semiconductor wafer to a supporting sheet via an adhesive layer, the second main surface of the semiconductor wafer being a main surface of a semiconductor substrate of each of the semiconductor device portions; and performing marking on the semiconductor substrate of each semiconductor device portion by applying a laser thereon, wherein in the step of performing marking, the laser is caused to pass through the supporting sheet and the adhesive layer and to be applied on the semiconductor substrate of each semiconductor device portion, and a carbide is attached to a region in which the marking is provided, the carbide made by carbonizing the adhesive layer using a heat generated by the laser.

According to the present invention, a marking can be formed by irradiating a main surface of each semiconductor device portion with a laser while the semiconductor device portions separated from a semiconductor wafer is attached on a supporting sheet. Thus, marking through laser irradiation can be collectively performed on the semiconductor device portions, whereby marking process can be simplified and manufacturing cost can be reduced.

In the semiconductor device according to the present invention, a marking is provided by laser irradiation on a back surface of the semiconductor device through which a semiconductor material is exposed. A carbide made by carbonizing a resin is attached to the portion at which the marking is provided. Thus, on the back surface of the semiconductor device, the portion at which the marking is provided can be visually distinguished from other portions, whereby a clear marking can be formed.

In a method for manufacturing a semiconductor device according to the present invention, a marking is formed by irradiating a back surface of the semiconductor device from which a semiconductor material is exposed with a laser that passes through a supporting sheet to which semiconductor device portions are attached. Thus, an adhesive layer located between the supporting sheet and the semiconductor device portion is carbonized by the laser irradiation and the carbonized material is attached to the back surface of the semiconductor device. Thus, a highly visible marking can be formed by attaching the carbonized material to the back surface of the substrate with an output and the like of the laser kept at a low level.

DETAILED DESCRIPTION OF THE DRAWINGS

First Embodiment

In this embodiment, a method for manufacturing a semiconductor device in which marking is performed by applying a laser on a main surface from which a semiconductor material is exposed is described with reference to FIG. 1 to FIG. 9.

Figure 1A:
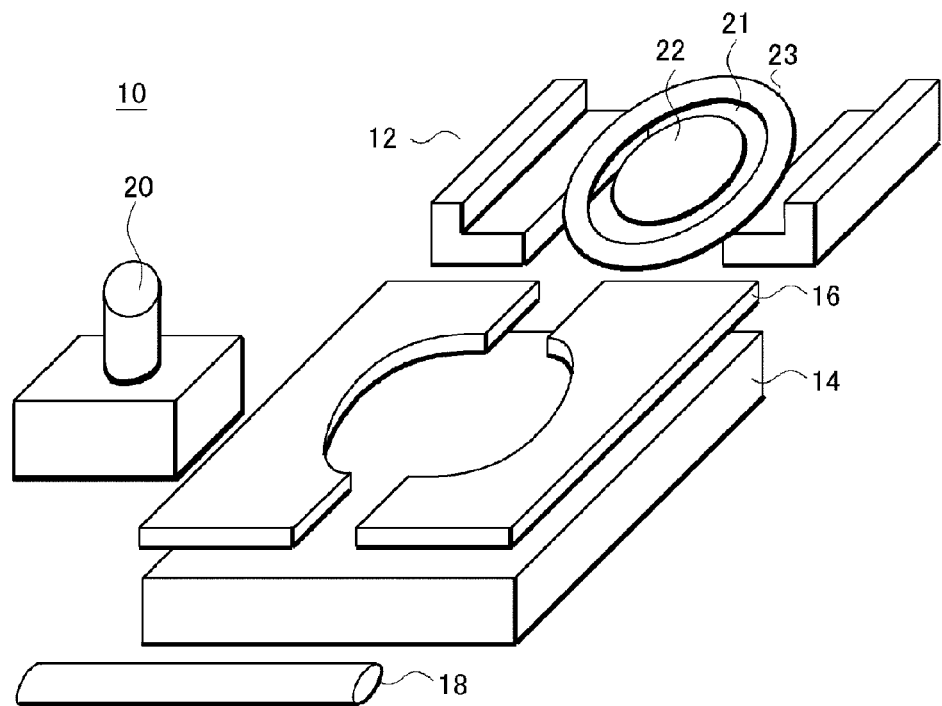
FIGS. 1A and 1B are an overall perspective view and a partially extracted view respectively of a marking device used for a method for manufacturing a semiconductor device according to the present invention.
Figure 1B:
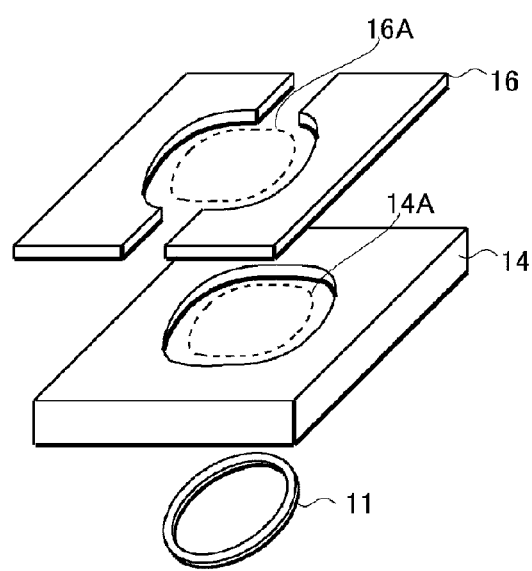

With reference to FIG. 1, first, a configuration of a marking device 10 used in the method of manufacturing a semiconductor device according to the present embodiment is described. Part (A) of FIG. 1 is a perspective view of a main portion of the marking device 10. Part (B) of FIG. 1 is a perspective view showing a configuration of a table 14 by which a semiconductor wafer is clamped.

With reference to Part (A) of FIG. 1, the marking device 10 mainly includes a transport rail 12 on which a semiconductor wafer 22 supported by a wafer ring 23 is placed, the table 14 on which the wafer ring 23 is fixed for the marking, an ionizer 18 that removes the charge of the semiconductor wafer 22, and an oscillator 20 that irradiates the semiconductor wafer 22 with a laser. The marking device 10 has an overall function of collectively irradiating the received semiconductor wafer with laser to form markings thereon.

The transport rail 12 is a portion on which the received semiconductor wafer 22 is placed. Specifically, the marking device 10 is supplied with the semiconductor wafer 22 attached on a dicing sheet 21 (supporting sheet) whose peripheral portion is supported by the wafer ring 23 (supporting ring). The transport rail 12 includes two rails each having an L-shaped cross section. The wafer ring 23 is placed on flat surfaces on the inner sides of the rails. The semiconductor wafer after being subjected to the marking by the laser irradiation is still placed on the transport rail 12.

The table 14 is a movable table on which the wafer ring 23 is fixed for the marking process. The table 14 can move in directions parallel to the main surface of the semiconductor wafer 22 attached on the wafer ring 23. Around the center of the table 14, an opening portion having a diameter larger than that of the semiconductor wafer is formed. In the marking, the laser is applied from below through the opening portion. The table 14 is located at a position near the transport rail 12 when receiving the wafer ring 23, moves in a slow speed below the ionizer 18 when the charge of the semiconductor wafer 22 is removed, and is located at a position above the oscillator 20 when the laser is applied on the semiconductor wafer 22.

A damper 16 includes two metal plates made of a stainless steel or the like. The two metal plates are disposed on the same plane while being separated from one another. The sides of the metal plates facing each other are each provided with a curved notch. The notches form a circular opening portion as a whole. The damper 16 is vertically movable with respect to the table 14. The damper 16 is positioned above and separated from the upper surface of the table 14 until the wafer ring 23 is placed on the upper surface of table 14. In the process of providing markings on the semiconductor wafer 22, the damper 16 presses the upper surface of the wafer ring 23 placed on the upper surface of the table 14 to fix the wafer ring 23. After the marking by the laser irradiation, the damper 16 again rises to release the wafer ring 23.

The ionizer 18 can artificially generate plus ions and minus ions and blow the air including these ions to the semiconductor wafer 22, the dicing sheet 21, and the wafer ring 23. Thus, the charge of the semiconductor wafer 22 and the like can be removed.

The oscillator 20 can irradiate the main surface of the semiconductor wafer 22 with a laser for the marking. In the present embodiment, the oscillator 20 emits a YAG (Yttrium Aluminum Garnet) laser that preferably has a wavelength of 532 nm. In the present embodiment, the laser passing through the dicing sheet 21 is applied on the bottom surface of the semiconductor wafer 22 attached on the upper surface of the dicing sheet 21.

As shown in Part (B) of FIG. 1, the damper 16 and the table 14 each include an opening portion. Specifically, the damper 16 includes two metal plates as described above and sides of the metal plates facing each other are each provided with the notch. Thus, an opening portion 16A is formed. The opening portion 16A has a circular shape with a diameter smaller than an outer diameter of the wafer ring 23 and larger than a diameter of the semiconductor wafer 22. By providing the opening portion 16A, the semiconductor wafer 22 can be exposed through the opening portion 16A after the wafer ring 23 is fixed by the damper 16. Thus, the position of the semiconductor wafer 22 can be recognized from above.

Also, an opening portion 14A having a size similar to that of the opening portion 16A is provided around the center of the table 14. The laser is applied on the semiconductor wafer 22 from below through this opening portion 14A.

A ring 11 is a piece of metal formed into a cylinder and has an outer diameter smaller than the diameters of the opening portion 16A and the opening portion 14A described above and an inner diameter larger than the diameter of the semiconductor wafer 22. When the wafer ring 23 is fixed on the table 14, the upper end of the ring 11 is located above the upper surface of the table 14. Thus, the dicing sheet 21 supported by the wafer ring 23 is pressed from below by the upper end of the ring 11, whereby the tension of the dicing sheet as a whole is increased. As a result, a wrinkle and slack of the dicing sheet 21 is straightened and the semiconductor wafer 22 is placed on a predetermined plane.

Figure 2A:
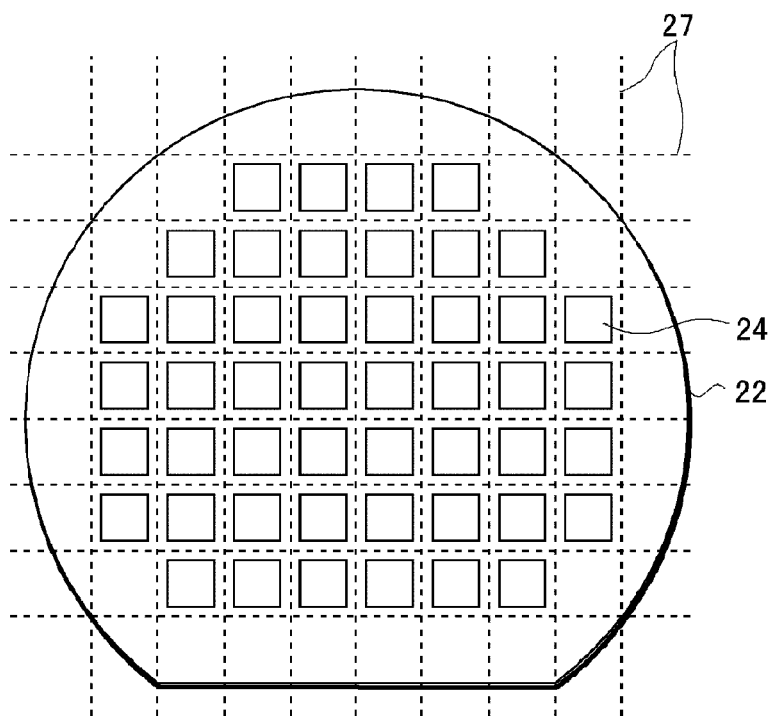
FIGS. 2A and 2B are a plan view and a cross-sectional view respectively for describing the method for manufacturing a semiconductor device according to the present invention.
Figure 2B:
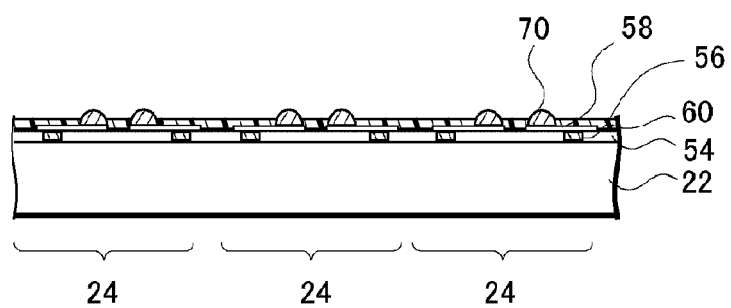

With reference to FIG. 2 and later, next, a method for manufacturing a semiconductor device using the marking device IS described. In the present embodiment, the marking by the laser irradiation is performed in the following condition. Specifically, the semiconductor wafer is divided into individual semiconductor device portions and the semiconductor wafer is transferred on the dicing sheet serving as a supporting sheet.

With reference to FIG. 2, the semiconductor wafer 22 is first prepared. Part (A) of FIG. 2 is a plan view of the semiconductor wafer 22, and Part (B) of FIG. 2 is a cross-sectional view of a part of the semiconductor wafer 22.

With reference to Part (A) of FIG. 2, a large number of (some hundreds of) semiconductor device portions 24 arranged in a matrix are formed in the semiconductor wafer 22. Each of the semiconductor device portions 24 is a portion to be a single semiconductor device. Dicing lines 27 in a lattice pattern are defined between the semiconductor device portions 24. In the later step, the semiconductor wafer 22 is separated into individual semiconductor devices along the dicing lines 27.

With reference to Part (B) of FIG. 2, in each of the semiconductor device portions 24, an element (diffusion region) such as a transistor is formed in the semiconductor wafer 22 by a diffusion process. Pads 56 connected to the elements are formed on the upper surface of the semiconductor wafer 22. On the upper surface of the semiconductor wafer 22, an insulating layer 54 made of an oxidized film and the like is formed with the pads 56 exposed. On the upper surface of the insulating layer 54, wirings 58 connected to the respective pads 56 are disposed, the wiring 58 extending from a peripheral portion towards the center of the semiconductor device portion 24. On the upper surface of the wiring 58 formed in a pad shape, an external electrode 70 made of a solder is deposited. A covering layer 60 made of resin covers the upper surface of the wiring 58 and the insulating layer 54 excluding the portions at which the external electrodes 70 are provided. The thickness of the semiconductor wafer 22 in this step depends on the diameter of the semiconductor wafer. For example, the semiconductor wafer 22 with the diameter of 50 mm (two inches) has the thickness of 280 μM, and the semiconductor wafer 22 with the diameter of 200 mm (eight inches) has the thickness of 725 μm.

Figure 3A:
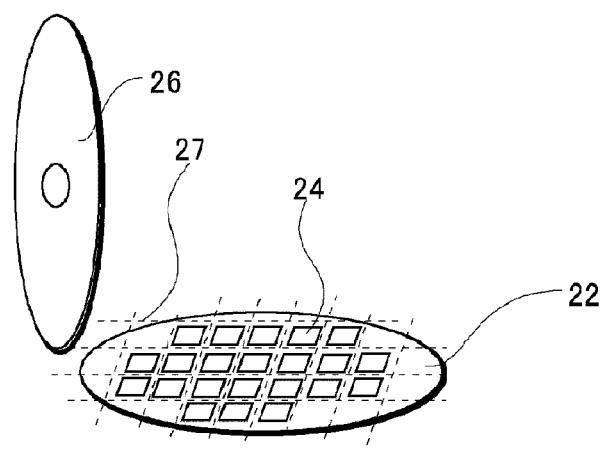
FIGS. 3A and 3B are a perspective view and a cross-sectional view respectively for describing the method for manufacturing a semiconductor device according to the present invention.
Figure 3B:
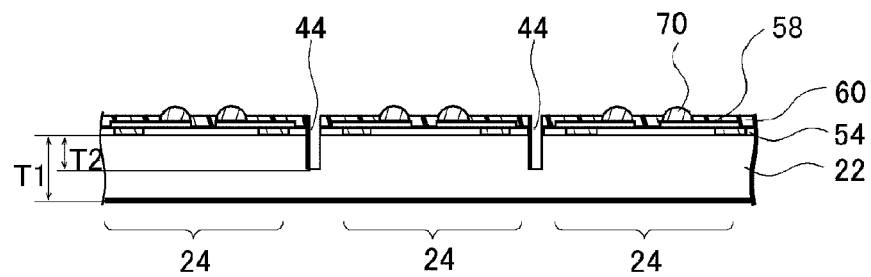

With reference to FIG. 3, subsequently, grooves 44 are formed on the front surface of the semiconductor wafer 22 (the surface on which the wirings 58 are formed) by dicing. Part (A) of FIG. 3 is a perspective view showing this step, and Part (B) of FIG. 3 is a cross sectional view of the semiconductor wafer 22 after the this step.

With reference to Part (A) of FIG. 3, in this step, the grooves 44 are formed between the semiconductor device portions 24 by moving a blade 26 rotating in high speed along the dicing lines 27 defined on the semiconductor wafer 22.

With reference to Part (B) of FIG. 3, in this step, the covering layer 60, the insulating layer 54, and the semiconductor wafer 22 are partly removed along the dicing lines 27. Thus, the dicing in the present step does not completely separate the semiconductor wafer 22, and the bottom end of the groove 44 is located in the semiconductor wafer 22.

A depth T2 of the groove 44 formed in this step is smaller than a thickness T1 of the semiconductor wafer 22 but is larger than a thickness of the semiconductor substrate of the semiconductor device to be manufactured. For example, the depth T2 of the groove 44 is about 110 μm when the semiconductor wafer 22 has the thickness T1 of 280 μm and the semiconductor substrate of the semiconductor device to be manufactured has the thickness of 100 μm. With the depth T2 of the groove 44 being smaller than the thickness of the semiconductor wafer 22, the semiconductor wafer 22 on which the grooves 44 are formed is not separated into individual pieces but has a form of a single plate. With the thickness T1 of the groove 44 being larger than the thickness of the semiconductor substrate of the semiconductor device to be manufactured, the semiconductor wafer 22 can be separated into individual pieces having a predetermined thickness in the later step.

Figure 4A:
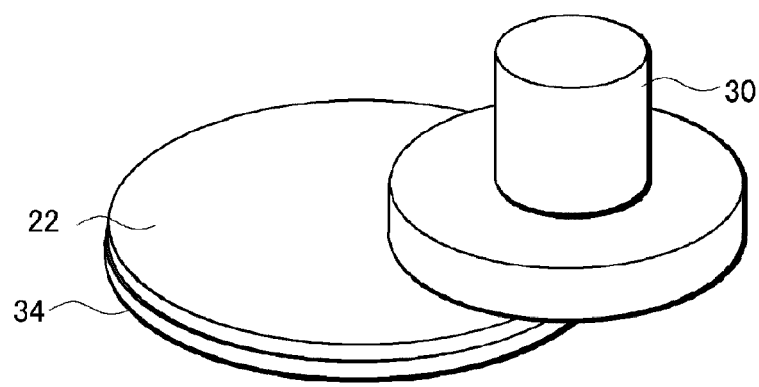
FIGS. 4A, 4B, and 4C are a perspective view and cross-sectional views respectively for describing the method for manufacturing a semiconductor device according to the present invention.
Figure 4B:
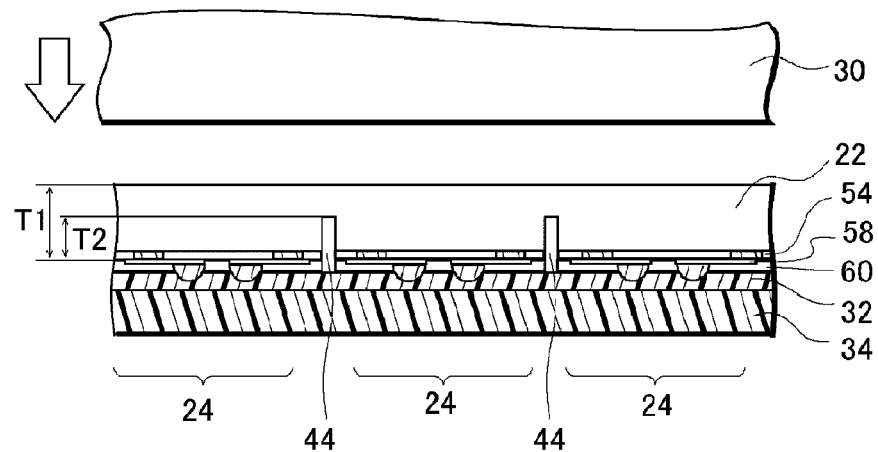
Figure 4C:
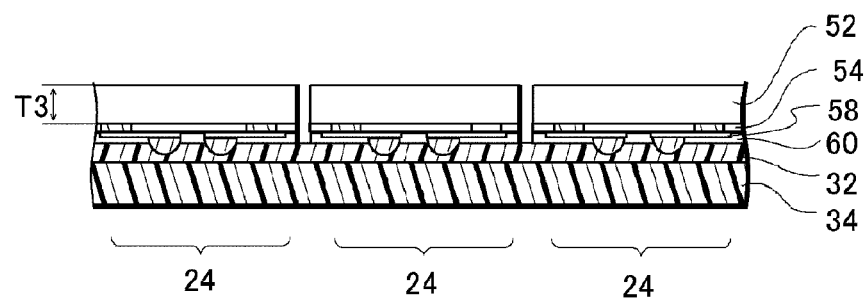

With reference to FIG. 4, next, the entire semiconductor wafer 22 is ground from the back surface. Thus, the semiconductor device portions 24 are separated at the portions at which the grooves 44 are formed. Part (A) of FIG. 4 is a perspective view showing this step, Part (B) of FIG. 4 is a cross-sectional view of the semiconductor wafer 22 before being separated by the grinding, and Part (C) of FIG. 4 is a cross-sectional view of the semiconductor device portions 24 after being separated in this step.

With reference to Part (A) of FIG. 4 and Part (B) of FIG. 4, first, a protective sheet 34 is attached on the main surface of the semiconductor wafer 22 on which the wirings 58 are formed. The protective sheet 34 and the semiconductor wafer 22 adhere to each other via an adhesive layer 32 formed on the upper surface of the protective sheet 34. Preferably, the adhesive layer 32 is an adhesive agent that cures to have lower adherence when a UV ray is applied thereon. The protective sheet 34 used in this step covers and protects the bottom surface of the semiconductor wafer 22 and thus does not have strength high enough to maintain the flatness of the separated semiconductor wafer 22. As shown in Part (A) of FIG. 4, the protective sheet 34 and the semiconductor wafer 22 have similar sizes in a plan view, and the outer peripheries of the semiconductor wafer 22 and the protective sheet 34 match.

The bottom surface of the protective sheet 34 attached to the semiconductor wafer 22 is fixed on an upper surface of a chuck table of a grinding device by being sucked thereon. The semiconductor wafer 22 is ground from the upper surface by rotating a grinder 30 having a grind stone on the bottom surface. Thus, the entire semiconductor wafer 22 is gradually thinned.

The back grinding in this step finishes when the semiconductor device portions 24 are separated at the portions at which the grooves 44 are formed. More specifically, the semiconductor wafer 22 is back ground from the upper surface until the thickness T1 (280 μm) of the semiconductor wafer 22 becomes smaller than the depth T2 (110 μm) of the groove 44.

With reference to Part (C) of FIG. 4, further back grinding by the grinder separates the semiconductor device portions 24 at the portions at which the grooves 44 are formed. The thickness T3 of the semiconductor substrate of the separated semiconductor device portion 24 is about 100 μm. The upper surface of the semiconductor device portion 24 is a surface from which a semiconductor material including silicon is exposed and is a rough surface ground by the grinder (grinding stone).

Figure 5A:
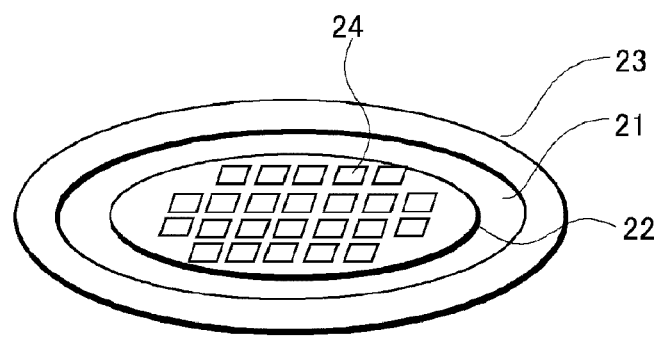
FIGS. 5A, 5B, and 5C are a perspective view and cross-sectional views respectively for describing the method for manufacturing a semiconductor device according to the present invention.
Figure 5B:
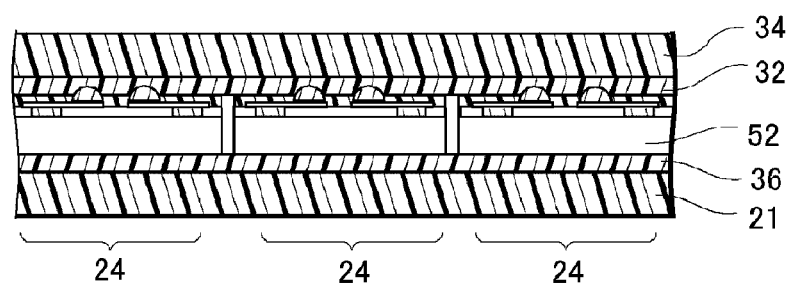
Figure 5C:
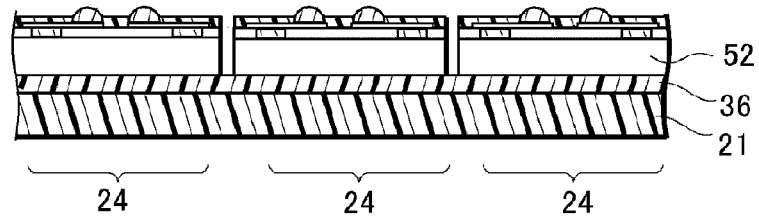

With reference to FIG. 5, subsequently, the semiconductor device portions 24 separated from the semiconductor wafer 22 are transferred on the dicing sheet 21 serving as the supporting sheet.

With reference to Part (A) of FIG. 5, a peripheral portion of the dicing sheet 21 is supported by the wafer ring 23 which is a piece of metal such as stainless steel formed into a ring shape. The main surface of the separated semiconductor device portion 24 from which the semiconductor material is exposed is attached to the upper surface of the dicing sheet 21.

With reference to Part (B) of FIG. 5, an adhesive layer 36 is formed on the upper surface of the dicing sheet 21. The adhesive layer 36 is an adhesive material including a general acryl resin or a UV-ray curable resin. The bottom surface of a semiconductor substrate 52 of the semiconductor device portion 24 contacts the adhesive layer 36. After the semiconductor device portion 24 is attached to the dicing sheet 21, the protective sheet 34 is separated from the semiconductor device portions 24 (semiconductor wafer 22). When the protective sheet 34 is a UV sheet, the protective sheet 34 is separated after an UV ray passing through the protective sheet 34 is applied on the adhesive layer 32 to lower the adherence thereof.

The semiconductor device portions 24 after the above step are shown in Part (C) of FIG. 5. At this point, the steps for separating the semiconductor wafer 22 into the semiconductor device portions 24 are completed. Thus, in the present embodiment, the dicing sheet 21 is not used as a sheet on which the semiconductor wafer is attached for the dicing. In the present embodiment, the dicing sheet 21 is used for mechanical supporting, transportation, and positioning for the semiconductor device portions 24 in the laser marking step. When the general manufacturing method for a WLP is employed, the semiconductor device portions 24 are separated by dicing the semiconductor wafer 22 after the dicing sheet 21 is attached to the semiconductor wafer 22.

With reference to FIG. 6 to FIG. 9, next, the laser is applied on the main surfaces of the semiconductor device portions 24 in the semiconductor wafer 22 to provide markings thereon. In this step, the laser is applied on the semiconductor device portions included in the semiconductor wafer 22 to collectively provide markings thereon using the marking device 10 shown in FIG. 1. Specific method for forming the marking is described below.

Here, the damper 16, the table 14, and the ring 11 in the drawings have configurations described with reference to FIG. 1.

Figure 6A:
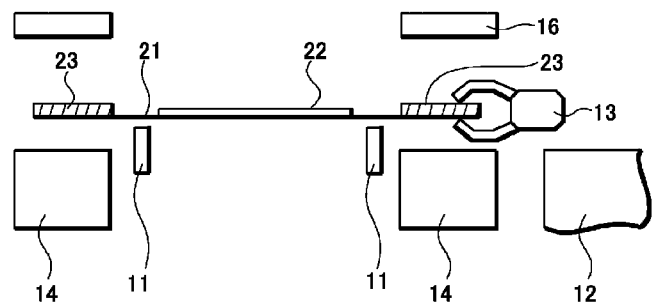
FIGS. 6A, 6B, and 6C are cross-sectional views respectively for describing the method for manufacturing a semiconductor device according to the present invention.
Figure 6B:
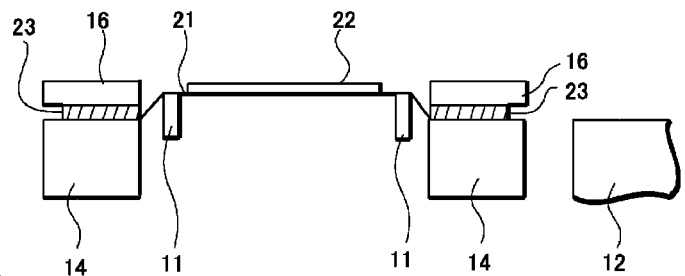
Figure 6C:
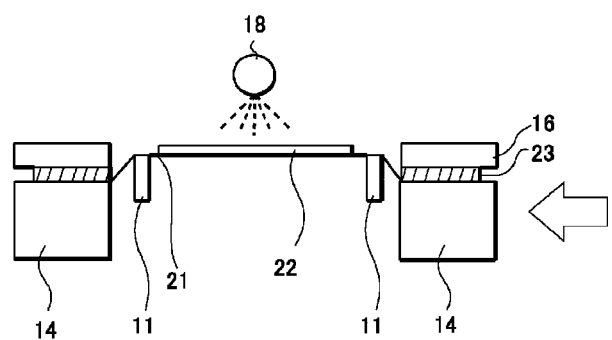

With reference to Part (A) of FIG. 6, first, the semiconductor wafer 22 is received in the transport rail 12 in the marking device. In this step, the divided semiconductor wafer 22 is received in the transport rail 12 while being attached to the dicing sheet 21 whose peripheral portion is supported by the wafer ring 23. The wafer ring 23 placed in the transport rail 12 is transported to the table 14 while being pinched by a transportation arm 13.

With reference to Part (B) of FIG. 6, subsequently, the vertically movable damper 16 is moved downward so that the wafer ring 23 is clamped and fixed by the bottom surface of the damper 16 and the upper surface of the table 14. The top end of the ring 11 is located above the upper surface of the upper surface of the table 14. Thus, by the clamping, the peripheral portion of the dicing sheet 21 is pressed from below by the ring 11. Accordingly, a tension is applied to the dicing sheet 21 by the pressing force of the ring 11 and thus wrinkles and slack of the dicing sheet 21 are removed. As a result, the semiconductor wafer 22 attached to the upper surface of the dicing sheet 21 can be accurately disposed at a predetermined height. If the slacking and the like of the dicing sheet 21 displace the semiconductor wafer 22 from its proper position in height, the focus of the laser applied from the bottom does not match the back surface of the semiconductor wafer 22. This causes a problem such as an unclear marking being formed. In the present embodiment, the pressing force of the ring 11 applies tension to the dicing sheet 21. Thus, the semiconductor wafer 22 is positioned on a plane at a predetermined height, whereby the focus of the laser matches the bottom 5 surface of the semiconductor wafer 22. Moreover, the wafer ring 23 is fixed on the table 14 until the marking process is completed. The damper 16, the table 14, and the ring 11 move integrally for the marking.

With reference to Part (C) of FIG. 6, next, the ionizer 18 blows an air including plus and minus ions on the dicing sheet 21 and the semiconductor wafer 22. This removes the charge of the semiconductor wafer 22 and the dicing sheet 21. Here, the table 14 on which the wafer ring 23 is fixed moves at a low speed while the ionizer 18 stays at a predetermined position. Specifically, the ionizer 18 blows ions while the table 14 moves from left to right in the drawing. Thus, the ions are blown onto the entire semiconductor wafer 22.

Figure 7A:
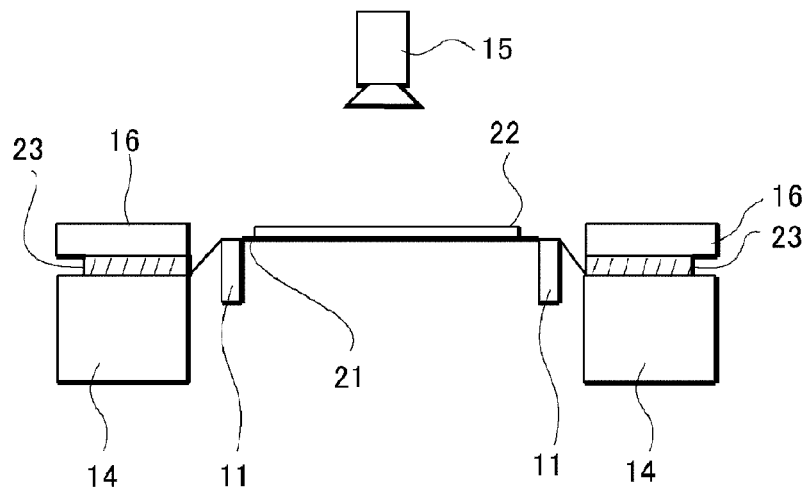
FIGS. 7A and 7B are a cross-sectional view and a plan view respectively for describing the method for manufacturing a semiconductor device according to the present invention.
Figure 7B:
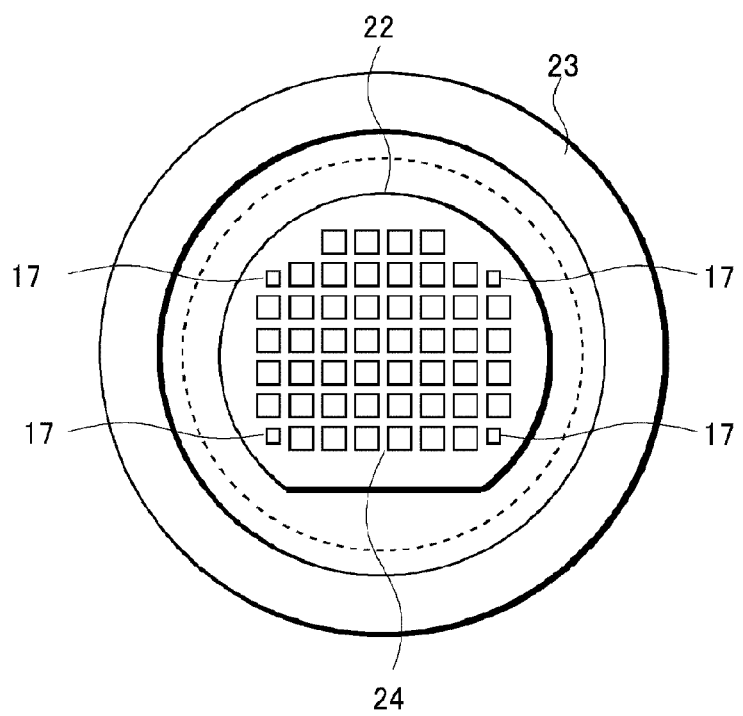
Figure 8A:
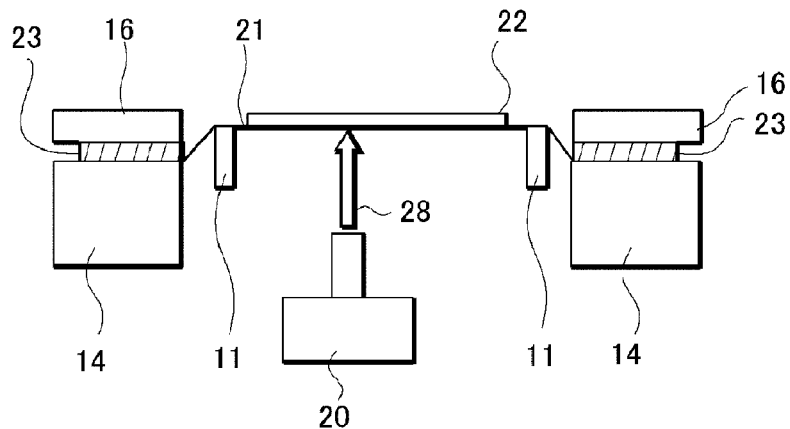
FIGS. 8A, 8B, 8C, and 8D are a cross-sectional view, enlarged cross-sectional views and an enlarged plan view respectively for describing the method for manufacturing a semiconductor device according to the present invention.
Figure 8B:
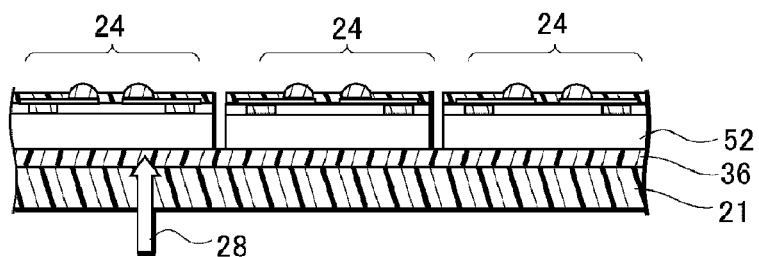
Figure 8C:
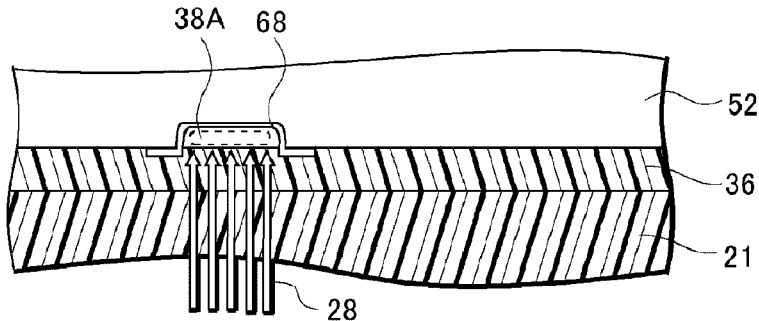
Figure 8D:
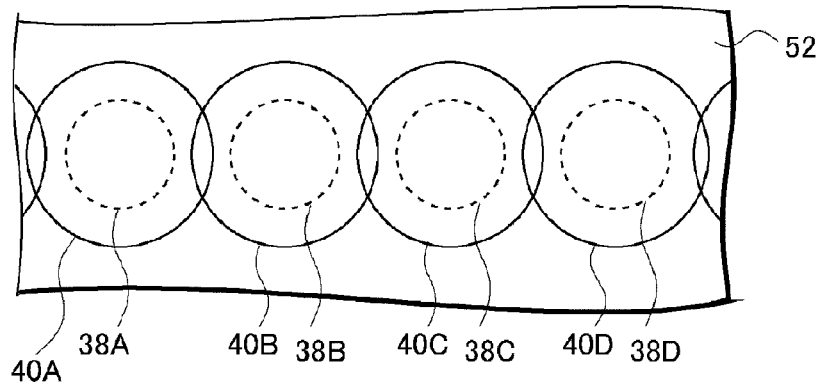

With reference to FIG. 7, subsequently, the position of the semiconductor wafer 22 is recognized. Part (A) of FIG. 7 is a cross-sectional view showing the present step, and Part (B) of FIG. 7 is a plan view showing the semiconductor wafer 22 fixed in the wafer ring 23.

With reference to Part (A) of FIG. 7, the table 14 is moved so that the semiconductor wafer 22 is positioned directly below a camera 15. Then, the camera 15 captures an image of the semiconductor wafer 22. Positional information is extracted from the captured image. The semiconductor wafer 22 is attached on the dicing sheet 21 with the surface on which the wirings and the solder electrodes are formed being the upper surface. Thus, the positioning can be performed based on the wirings.

In the present embodiment, as shown in Part (B) of FIG. 7, the positions of marks 17 formed on the upper surface of the semiconductor wafer 22 are recognized. The relative positional relationship among the positions of the marks 17, the outer shape of the semiconductor wafer 22, and the positions of the semiconductor device portions 24 is obtained in advance. Thus, the center position of the semiconductor wafer 22 and the positions of the semiconductor device portions 24 can be recognized by recognizing the positions of the marks 17.

Four marks 17 are provided on the front surface of the semiconductor wafer 22 on the outer side than the area where the semiconductor device portions 24 are formed. The marks 17 are formed of a material the same as that of the wiring for example. The number of marks 17 may be more or less than four as long as the center position of the semiconductor wafer 22 and the positions of the semiconductor device portions 24 can be recognized therewith.

With reference to FIG. 8, next, the laser is applied on the semiconductor device portions 24 included in the semiconductor wafer 22 to provide the markings thereon. Part (A) of FIG. 8 is a cross-sectional view showing this step, Part (B) of FIG. 8 is an enlarged cross-sectional view, Part (C) of FIG. 8 is a cross-sectional view showing a state where the laser is applied, and Part (D) of FIG. 8 is a plan view showing a state where the marking is formed by the application of the laser in an enlarged state.

With reference to Part (A) of FIG. 8, first, based on the position information of the semiconductor wafer 22 obtained in the preceding step, the table 14 is moved so that a predetermined portion of the semiconductor wafer 22 is positioned above the oscillator 20. Then, a laser 28 having a predetermined wavelength is applied on the bottom surface of the semiconductor wafer 22 from the oscillator 20. The laser 28 reaches the semiconductor wafer 22 through the opening portion of the table 14 and the inner side of the ring 11 (see, Part (B) of FIG. 1).

With reference to Part (B) of FIG. 8, in the present step, the laser 28 from the bottom is applied on the dicing sheet 21 to which the plural semiconductor device portions 24 are attached via the adhesive layer 36 on the upper surface. The laser 28 reaches the bottom surface of the semiconductor substrates 52 of the semiconductor device portions 24 after passing through the transparent dicing sheet 21 and the adhesive layer 36.

The laser 28 used in the present step is a YAG laser and especially preferably, a YAG laser having a wavelength of 532 nm. A YAG laser having wavelength of 1064 nm may also be used. However, applying the YAG laser having such a long wavelength on the upper surface of the semiconductor substrate 52 may result in the laser entering the thin semiconductor substrate 52. Thus, the characteristics of the element region formed near the upper surface of the semiconductor substrate 52 may deteriorate. To prevent this, the YAG laser having a short wavelength of 532 nm is used in the present embodiment. When the laser 28 having the short wavelength is applied, the majority of the laser 28 is reflected by the upper surface of the semiconductor substrate 52 and thus the laser 28 hardly enters the semiconductor substrate 52. Thus, the element region formed near the upper surface of the semiconductor substrate 52 is not adversely affected by the laser.

The output of the laser 28 to be irradiated is about 6 W. The irradiated area of the laser 28 has a circular shape with a diameter of about 30 μm. The size of the irradiated area is substantially the same as the size of a recess 38A in a plan view (see Part (D) of FIG. 8). In this embodiment, the output and the irradiation time of the laser 28 are set to such levels that the adhesive layer 36 does not vaporize by the generated heat. Thus, the semiconductor device portions 24 are prevented from being separated from the dicing sheet 21 due to the vaporizing of the adhesive layer 36 by the heat generated by the laser 28 irradiation.

With reference to Part (C) of FIG. 8, in the present step, the marking is formed by the repetitive shot (pulse) irradiation of the laser 28. The irradiated laser 28 passes through the dicing sheet 21 and the adhesive layer 36 to reach the bottom surface of the semiconductor substrate 52. Thus, portions on which the laser 28 is applied are excavated, whereby the recesses 38A are formed thereat. The temperature at the recess 38A and its peripheral portion in the bottom surface of the semiconductor substrate 52 becomes high due to the application of the laser 28. Thus, the adhesive layer 36 attached thereto is carbonized. A carbide 68 made of the carbonized adhesive layer 36 is attached to the recess 38A and its peripheral portion (carbonized region 40A shown in Part (D) of FIG. 8). In the present step, shot irradiation of the laser 28 is performed along the shape of the marking to be formed.

Part (D) of FIG. 8 shows the recesses 38A to 38D and carbonized regions 40A to 40D formed by the laser 28. The application of the laser 28 forms the recesses 38A to 38D separated at equal intervals and the carbonized regions 40A to 40D arranged concentrically with the respective recesses 38A to 38D. Adjacent ones of the carbonized regions (e.g., the carbonized region 40A and the carbonized region 40B) partly overlap. Thus, the marking in a line form is formed by the continuous carbonized regions 40A to 40D.

Figure 9A:
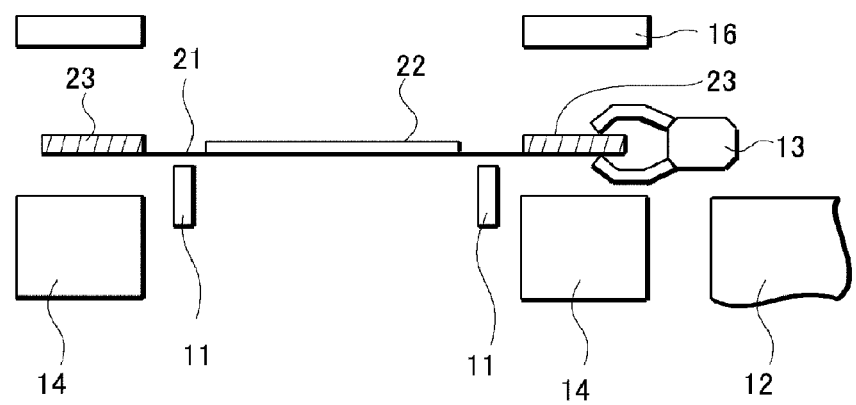
FIGS. 9A and 9B are a cross-sectional view and an enlarged cross-sectional view respectively for describing the method for manufacturing a semiconductor device according to the present invention.
Figure 9B:
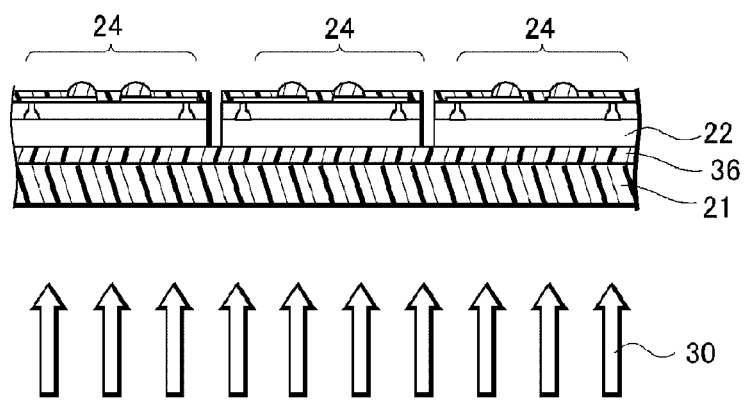
Figure 10A:
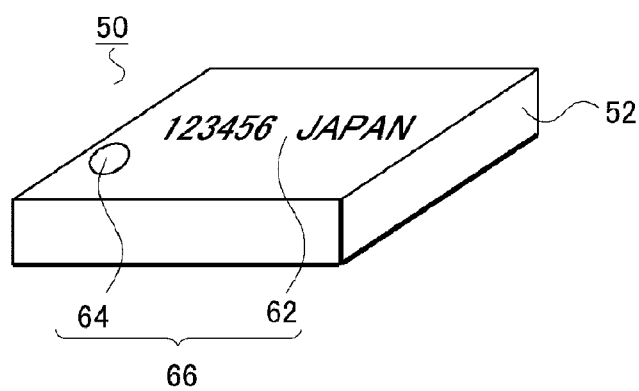
FIGS. 10A, 10B, 10C, and 10D are a perspective view, a cross-sectional view, an enlarged plan view, and an enlarged cross-sectional view respectively of a semiconductor device manufactured by the method for manufacturing a semiconductor device according to the present invention.
Figure 10B:
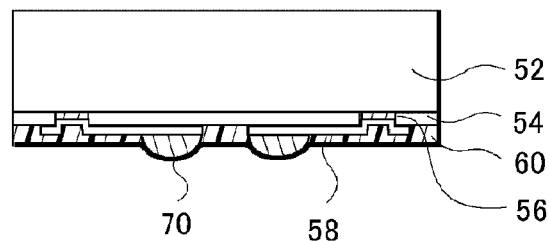
Figure 10C:
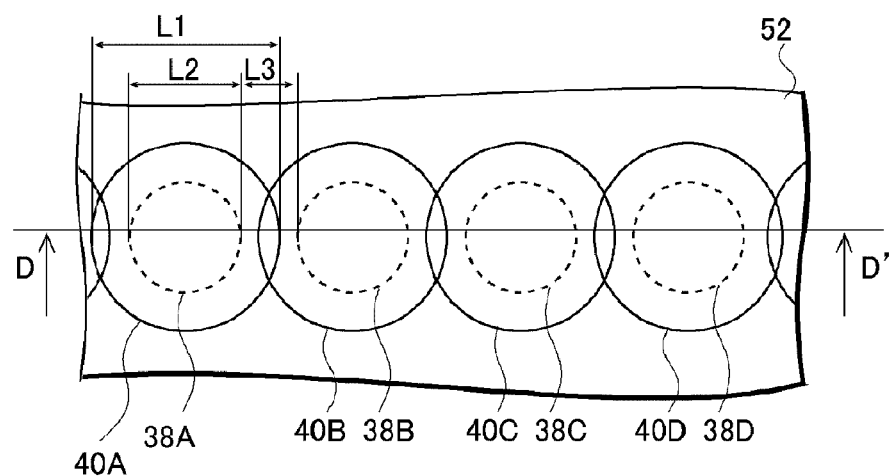
Figure 10D:
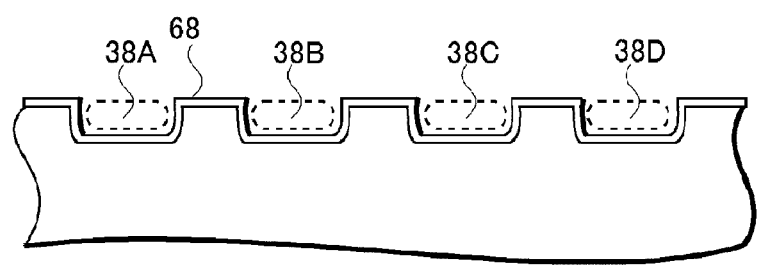
Figure 11A:
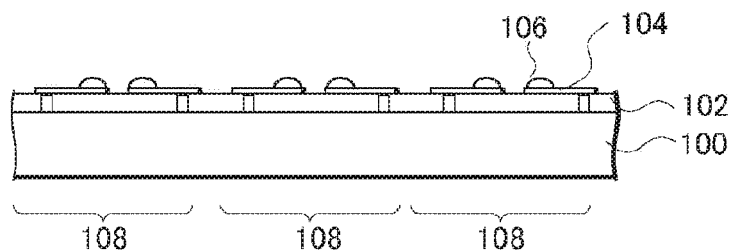
FIGS. 11A, 11B, 11C, and 11D are cross-sectional views for describing a method for manufacturing a semiconductor device of the background art.
Figure 11B:
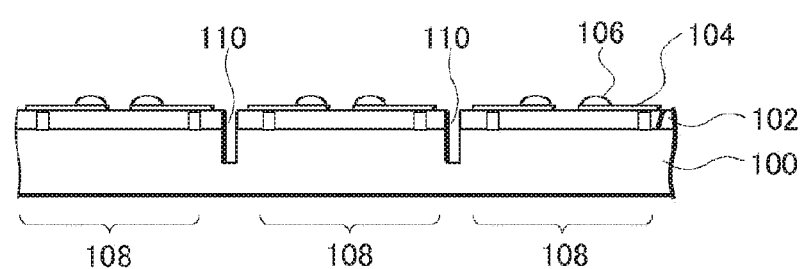
Figure 11C:
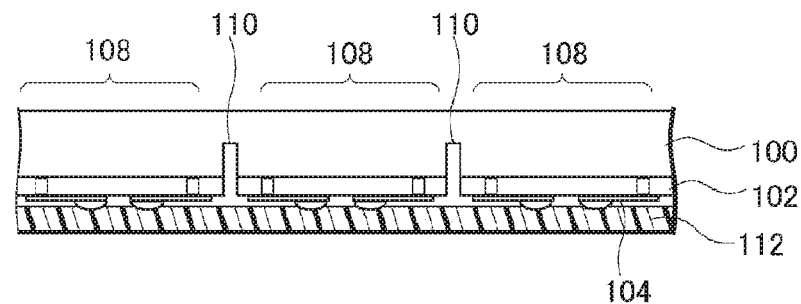
Figure 11D:
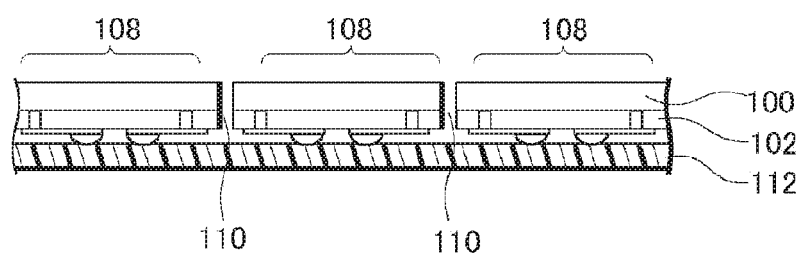
Figure 12A:
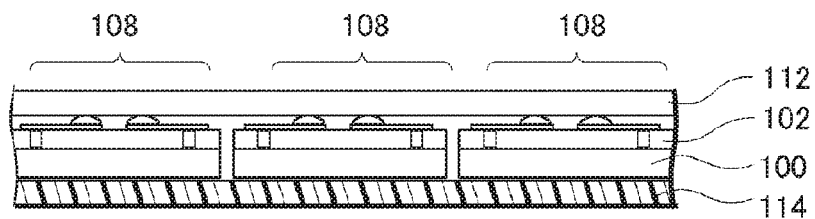
FIGS. 12A and 12B are cross-sectional views for describing the method for manufacturing a semiconductor device of the background art.
Figure 12B:
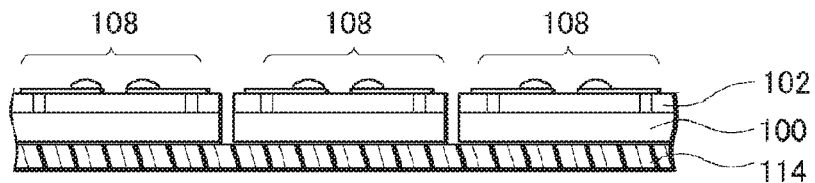

With reference to Part (A) of FIG. 9, after the marking is completed, the table 14 moves near the transport rail 12, and the wafer ring 23 is released by moving the damper 16 vertically upward. Then, the transportation arm 13 pinches the wafer ring 23 and the wafer ring 23 is moved to the transport rail 12 to be extracted from the marking device.

With reference to Part (B) of FIG. 9, next, the semiconductor device portions 24 are separated from the dicing sheet 21. If the adhesive layer 36 is an adhesive agent cured by the UV ray radiation, first, a UV ray is applied to the adhesive layer 36 through the dicing sheet 21 from the bottom surface of the dicing sheet 21. Then, the semiconductor device portions 24 are separated from the dicing sheet 21 using an adsorption collet and then are contained in a container.

In the above description, the laser marking is performed on the semiconductor wafer 22 separated into the semiconductor device portions 24 in the laser marking step. Instead, the laser marking may be performed on the semiconductor wafer 22 before being separated. In this case, with reference to FIG. 8, the unseparated semiconductor wafer 22 is attached on the upper surface of the dicing sheet 21 and the laser is applied thereto from below. By the dicing after the laser marking, the semiconductor wafer 22 is separated into individual semiconductor device portions.

Second Embodiment

With reference to FIG. 10, a semiconductor device 50 manufactured by the above manufacturing method is described. Part (A) of FIG. 10 is a perspective view of the semiconductor device 50, Part (B) of FIG. 10 is a cross-sectional view, Part (C) of FIG. 10 is an enlarged plan view of a portion at which a marking is formed, Part (D) of FIG. 10 is a cross-sectional view taken along the line D-D' in Part (C) of FIG. 10.

With reference to Part (A) of FIG. 10 and Part (B) of FIG. 10, the semiconductor device 50 includes the semiconductor substrate 52, the wirings 58 formed on the semiconductor substrate 52, and the like. The laser is applied on the upper surface of the semiconductor substrate 52 from which the semiconductor material is exposed to form markings 66 thereat. The semiconductor substrate 50 of this embodiment is a WLP having upper and side surfaces from which the semiconductor material is exposed and a bottom surface on which the external electrodes 70 made of a solder are arranged in a grid form.

The semiconductor substrate 52 is made of a semiconductor material such as silicon and an element region is formed near the bottom surface thereof by a diffusion process. For example, a bipolar transistor, a MOSFET, a diode, an IC, a LSI, and the like are formed inside the semiconductor substrate 52. The thickness of the semiconductor substrate 52 is about 50 μm to 100 μm. The upper surface of the semiconductor substrate 52 is a rough surface ground in the grinding process.

With reference to Part (B) of FIG. 10, the bottom surface of the semiconductor substrate 52 is provided with the pads 56 electrically connected to the element region (active region) formed by the diffusion process. The bottom surface of the semiconductor substrate 52 is covered by the insulating layer 54 except for the portions at which the pads 56 are formed. The insulating layer 54 is made of a nitride film or a resin film for example.

The bottom surface of the insulating layer 54 is provided with the wirings 58 connected with the respective pads 56.

Here, the pads 56 are formed in a peripheral portion of the semiconductor device 50. The wiring 58 extends from the peripheral portion towards the center. The wiring 58 is partly formed into a pad shape. The external electrode 70 made of a conductive adhesive material such as a solder is deposited on the pad shaped portion. The bottom surfaces of the wiring 58 and the insulating layer 54 are covered by the covering layer 60 made of an insulating material such as resin except for the portions at which the external electrodes 70 are formed.

With reference to Part (A) of FIG. 10, the upper surface of the semiconductor substrate 52 is provided with the markings 66. Here, the markings 66 include a position mark 64 and a sign mark 62. The position mark 64 is provided for detecting a planer position (angle) of the semiconductor device 50. The position mark 64 is provided at the lower left corner portion of the semiconductor device 50. The sign mark 62 includes letters and numbers to indicate the name of manufacturer, the manufactured date, the product name, the lot number, the characteristics of the element to be incorporated, and the like. In the present embodiment, the markings 66 are formed by irradiating the upper surface of the semiconductor substrate 52 with the laser.

With reference to Part (C) of FIG. 10 and Part (D) of FIG. 10, the configuration of the above marking 66 is described. The marking 66 to be formed on the upper surface of the semiconductor substrate 52 is formed by intermittently applying the laser on the be written. Accordingly, recesses excavated by the laser irradiation are arranged while being separated at equal intervals on the upper surface of the semiconductor substrate 52 on which the marking 66 is formed. Here, the recesses 38A to 38D are linearly arranged while being separated at equal intervals. The recesses 38A to 38D each have a circular shape with the diameter L2 of about 30 μm, for example, in a plan view. The recesses 38A and 38B are separated with a distance L3 of about 15 μm, for example. Other recesses 38B and 38D are also separated at equal intervals.

On the upper surface of the semiconductor substrate 52, the carbonized regions 40A to 40D are formed at the portions at which the recesses 38A to 38D are formed and their peripheral portions. In the carbonized regions 40A to 40D, the carbide made by carbonizing a resin material is attached to the surface of the semiconductor substrate 52. The resin material is, for example, an adhesive agent (e.g., acryl resin) used for attaching the upper surface of the semiconductor device 50 to the resin sheet. The surface portions of the carbonized regions 40A to 40D are extracted and analyzed. The result has indicated that the surface portions each include 7 weight % or more of carbon C.

In the carbonized regions 40A to 40D, the carbide 68 made of carbonized adhesive material is stiffly attached to the upper surface of the semiconductor substrate 52. Thus, even when agents such as ethanol and butanone are applied to the carbonized regions 40A to 40D and then the carbonized regions 40A to 40D are rubbed, the majority of the carbide 68 stays on the semiconductor substrate 52 without being peeled off. Thus, the friction force applied on the upper surface of the semiconductor device 50 hardly deteriorates the visibility of the marking 66 made of the carbide 68.

The carbonized region 40A is arranged concentrically with the recess 3SA and is larger than the recess 38A. The carbonized region 40A has a diameter L1 of about 40 μm, for example. The reason why the carbonized region 40A is formed to have a larger size than the recess 38A is as follows. Specifically, it is because applying the laser on the recess 38A heats the semiconductor substrate 52 at the recess 38A and its peripheral portion, whereby the resin material (adhesive material) at the areas is carbonized and attached to the surface of the semiconductor substrate 52.

As described above, the carbonized region 40A is concentric with the recess 38A and is larger than the recess 38A in a plan view. Accordingly, even when the recess 38A and the recess 38B adjacent to each other are separated, the carbonized region 40A and the carbonized region 40B partially overlap. Specifically, the carbonized region 40A and the carbonized region 40B partially overlap when double the length obtained by subtracting the diameter L2 of the recess 38A from the diameter L1 of the carbonized region 40A is longer than the distance L3 between the recess 38A and the recess 38B. The adjacent carbonized regions partially overlap as described above and thus a large number of continuously formed carbonized regions 40A to 40D form a linear shape to represent signs such as numbers and letters as a whole.

The invention claimed is:

1. A method for manufacturing a semiconductor device, the method comprising the steps of:
    attaching a semiconductor wafer comprising semiconductor device portions to a supporting sheet with an adhesive layer interposed therebetween; and
    performing marking on a main surface of the semiconductor wafer by causing a laser to pass through the supporting sheet and the adhesive layer and to be applied on the main surface;
    wherein in the step of performing marking,
    a plurality of recesses are provided that are separated from each other and made by locally indenting the main surface of the semiconductor substrate through shot irradiation of the laser, and
    each of the plurality of recesses is provided with a carbonized region in which the adhesive layer is carbonized on the recess and a peripheral portion of the recess, and
    one of the carbonized regions adjacent to each other and another one of the carbonized regions adjacent to each other partially overlap each other.

2. The method for manufacturing a semiconductor device according to claim 1, wherein the carbonized region is formed by a carbide made by carbonization by the application of the laser.

3. The method for manufacturing a semiconductor device according to claim 1,
    wherein
    attaching the semiconductor wafer includes providing the supporting sheet having a peripheral portion supported by a supporting structure; and
    performing the marking comprises providing a marking on a plurality of semiconductor device portions included in the semiconductor wafer.

4. The method for manufacturing a semiconductor device according to claim 1, wherein a position of an alignment mark on the semiconductor wafer is recognized to align a position of an irradiator that irradiates the laser with a position of each of the semiconductor device portions included in the semiconductor wafer.

5. The method for manufacturing a semiconductor device according to claim 1, wherein the supporting sheet comprises a dicing sheet.

6. The method for manufacturing a semiconductor device according to claim 1 further comprising the step of
    removing charge of the semiconductor wafer using an ionizer before the step of performing the marking.

7. A method for manufacturing a semiconductor device, the method comprising the steps of:
   preparing a semiconductor wafer including a first main surface and a second main surface that are opposite surfaces, as well as semiconductor device portions that are arranged in a matrix and include wirings formed on a side of the first main surface;
   separating the semiconductor wafer along border lines between the semiconductor device portions;
   attaching the second main surface of the semiconductor wafer to a supporting sheet via an adhesive layer, the second main surface of the semiconductor wafer being a main surface of a semiconductor substrate of each of the semiconductor device portions; and
   performing marking on the semiconductor substrate of each semiconductor device portion by applying a laser thereon, wherein
   in the step of performing marking, the laser is caused to pass through the supporting sheet and the adhesive layer and to be applied on the semiconductor substrate and a carbide is attached to a region in which the marking is provided;
   wherein in the step of performing marking,
   a plurality of recesses are provided that are separated from each other and made by locally indenting the main surface of the semiconductor substrate through shot irradiation of the laser, and
   each of the plurality of recesses is provided with a carbonized region in which the adhesive layer is carbonized on the recess and a peripheral portion of the recess, and
   one of the carbonized regions adjacent to each other and another one of the carbonized regions adjacent to each other partially overlap each other.

8. The method for manufacturing a semiconductor device according to claim 7, wherein the laser has a wavelength of 532 nm.

9. The method for manufacturing a semiconductor device according to claim 7, wherein the supporting sheet is a dicing sheet whose peripheral portion is supported by a support structure.

10. The method for manufacturing a semiconductor device according to claim 7, wherein separating the semiconductor wafer includes separating from the side of the first main surface along border lines between the semiconductor device portions; to form grooves each having a depth smaller than a thickness of the semiconductor wafer, and wherein the method further comprises separating the semiconductor device portions at portions at which the grooves are formed by removing material from the semiconductor wafer from a side of the second main surface.

11. The method for manufacturing a semiconductor device according to claim 7, wherein:
   in the step of performing marking, the laser is caused to pass through the supporting sheet and the adhesive layer and applied on each semiconductor device portion, and the carbide is made by carbonizing the adhesive layer using heat generated by the laser.

12. The method for manufacturing a semiconductor device according to claim 1, wherein the step of performing marking including forming a marking structure on the main surface comprising:
   a plurality of recesses extending generally inward from the main surface, wherein each recess is separated by portions of the main surface; and
   a carbide layer lining the plurality of recesses and overlapping the portions of the second main surface as a continuous layer, wherein the carbide layer comprises a plurality of carbonized regions, and wherein one of the carbonized regions adjacent to another one of the carbonized regions partially overlap each other.

13. A method for forming a semiconductor device comprising:
   providing a semiconductor wafer having a plurality of semiconductor device portions and having a major surface attached to a supporting sheet; and
   applying a laser through the supporting sheet onto the major surface of the semiconductor wafer to form a marking structure on the major surface, wherein applying laser through the supporting sheet provides a material attached to the major surface configured to enhance visibility of the marking structure;
   wherein applying the laser provides a carbide resin material attached to the major surface;
   wherein applying the laser provides a marking structure comprising:
   a plurality of recesses extending generally inward from the main surface, wherein each recess is separated by portions of the main surface; and the material lining the plurality of recesses and overlapping the portions of the second main surface as a continuous layer, wherein the material comprises a plurality of carbonized regions, and wherein one of the carbonized regions adjacent to another one of the carbonized regions partially overlap each other.

14. The method of claim 13, wherein providing the semiconductor wafer including providing a supporting sheet having an adhesive layer interposed between the major surface and the supporting sheet.

15. The method of claim 13 wherein applying the laser provides marking structures on a plurality of the semiconductor device portions.

16. The method of claim 13 further comprising separating the semiconductor wafer into the semiconductor device portions.

17. The method of claim 13, wherein applying the laser provides a marking structure comprising at least one of a position mark and a sign mark.

* * * * *